United States Patent [19]

Kakuhashi et al.

[11] 4,283,248
[45] Aug. 11, 1981

[54] ETCHING SOLUTION FOR TIN-NICKEL ALLOY AND PROCESS FOR ETCHING THE SAME

[75] Inventors: Takeshi Kakuhashi; Kazuo Fukunaga, both of Ibaraki, Japan

[73] Assignee: Nitto Electric Industrial Co., Ltd., Ibaraki, Japan

[21] Appl. No.: 117,692

[22] Filed: Feb. 1, 1980

[30] Foreign Application Priority Data

Feb. 1, 1979 [JP] Japan .................................. 54-10844
Nov. 26, 1979 [JP] Japan ............................... 54-152647

[51] Int. Cl.$^3$ ........................ C09K 13/06; C23F 1/00
[52] U.S. Cl. .................................. 156/637; 75/119; 156/656; 156/664; 252/79.1; 252/79.2; 252/79.4
[58] Field of Search .................... 252/79.2, 79.1, 79.4; 156/656, 664, 637; 423/90, 98, 150, 305, 311; 134/3; 75/119

[56] References Cited

U.S. PATENT DOCUMENTS

| | | |
|---|---|---|
| 3,125,475 | 3/1964 | Livingston et al. ................. 252/79.2 |
| 3,399,143 | 8/1968 | Slominski ............................. 423/150 |
| 3,425,881 | 2/1969 | Cohn .................................... 252/79.2 |
| 3,457,107 | 7/1969 | Mickelson et al. .................. 252/79.2 |
| 3,551,122 | 12/1970 | Gulla .................................... 252/79.1 |
| 3,575,747 | 4/1971 | Cohn .................................... 252/79.2 |
| 3,647,699 | 3/1972 | Doty et al. ........................... 252/79.2 |
| 3,671,274 | 6/1972 | Maekawa et al. .................... 252/79.2 |
| 3,839,534 | 10/1974 | Matsumoto et al. ................. 423/305 |
| 3,971,683 | 7/1976 | Briska et al. ........................ 252/79.2 |
| 3,990,982 | 11/1976 | Dixon ................................... 156/664 |
| 4,042,451 | 8/1977 | Lash et al. ........................... 156/656 |
| 4,104,111 | 8/1978 | Mack .................................... 156/656 |
| 4,124,516 | 11/1978 | Shinozaki et al. ................... 252/79.2 |

OTHER PUBLICATIONS

"Phosphoric Acids and Phosphates", Kirk-Othmer Encyclopedia of Chemical Technology, vol. 15., John Wiley & Sons, Inc., (1968), pp. 234, 241, 316.
Weast, ed., Handbook of Chemistry and Physics, The Chemical Rubber Co., Cleve., Ohio (1967), p. B-175.

*Primary Examiner*—Jerome W. Massie
*Attorney, Agent, or Firm*—Sughrue, Mion, Zinn, Macpeak and Seas

[57] ABSTRACT

An etching solution containing 0.1 mol/l or more phosphoric acid, 0.05 mol/l or more pyrophosphoric acid, 0.1 mol/l or more phosphorous acid, 0.1 mol/l or more of a mixture of phosphoric, pyrophosphoric and/or phosphorous acids, molten phosphoric acid, molten pyrophosphoric acid, molten phosphorous acid or a molten mixture of phosphoric, pyrophosphoric and/or phosphorous acids, for use in etching a tin-nickel alloy; and a process for etching the tin-nickel alloy with the etching solution.

45 Claims, 12 Drawing Figures

ETCHING SOLUTION FOR TIN-NICKEL ALLOY AND PROCESS FOR ETCHING THE SAME

BACKGROUND OF THE INVENTION

1. Field of the Invention

This invention relates to an etching solution for a tin-nickel alloy. More particularly, it is concerned with an etching solution capable of selectively etching a tin-nickel alloy when the tin-nickel alloy coexists with copper. The invention also relates to a process for etching a tin-nickel alloy.

2. Description of the Prior Art

A printed circuit board with resistors, which is produced using a laminated material wherein a resistor film is provided on at least one side of an insulative support and a high conductive layer such as copper is provided on the resistor film, is well known in the art.

Recently, as a resistor film of a printed circuit board, a nickel film, a nickel-phosphorus film, a nickel-molybdenum film, etc., which are formed by electroplating, have been proposed and employed. These films, however, generally have many problems in terms of their physical properties, workability and so on.

The inventors have developed a printed circuit board with resistors in which a tin-nickel alloy film formed by electroplating is used as a resistor film. This printed circuit board is disclosed and explained in detail in Japanese Patent Application (OPI) No. 72468/79 (The term "OPI" as used herein refers to a "published unexamined Japanese patent application").

In general, the plating of a tin-nickel alloy is carried out by chemical plating wherein a hydrazine hydrate, sodium hypophosphite or the like is used as a reducing agent; electroplating using a fluoride bath wherein sodium fluoride, acidic ammonium fluoride or the like, or a pyrophosphoric acid bath containing tin pyrophosphate, potassium pyrophosphate or the like, and so on. In plating the tin-nickel alloy for forming the resistor film of the printed circuit board, electroplating is preferably employed since the film thickness and the composition of bath are more easily controlled. In particular, electroplating using the fluoride bath is preferred in that over a wide range of bath compositions, an alloy containing tin and nickel in substantially equiatomic ratio (i.e., 64 to 70% by weight tin) is obtainable.

The tin-nickel alloy film is excellent in socalled smoothness and uniform electroplating as well as in the stability of its composition and, therefore, it is an excellent resistor film. However, many difficulties are encountered in producing the printed circuit board with resistors by selectively etching the tin-nickel alloy film on a copper film because it exhibits a quite high resistance against etching.

The printed circuit board with resistors in which the tin-nickel alloy is used as the resistor film is produced by, for example, the following procedure as described in Japanese Patent Application (OPI) No. 72468/79.

First, a tin-nickel alloy is plated on one side of a copper foil and on the thus plated tin-nickel alloy film, an insulative support, such as a glass cloth impregnated with an epoxy resin, is placed and bonded to produce a laminated plate material. The surface of the copper foil in the laminated plate material is covered with a photoresist. The photoresist is then exposed to light through a photomask having a combined pattern of conductor and resistor areas and developed. Thus, the photoresist is left corresponding to the pattern, and at the areas not covered with the photoresist, the copper foil is removed by etching, exposing the surface of the tin-nickel alloy. The thus exposed tin-nickel alloy film is also removed by etching, exposing the surface of the insulative support.

Then, the remaining photoresist is removed, and the surface of the laminated plate material is again covered with a fresh photoresist. In the same manner as described above, a photomask having a conductor pattern is employed and the photoresist is left corresponding to the conductor pattern of the photomask. At the areas not covered with the photoresist, the copper foil is removed, exposing the tin-nickel alloy film. Thereafter, on removing the remaining photoresist, a circuit corresponding to the above conductor and resistor pattern is formed on the insulative support, and thus a printed circuit board with resistors is obtained.

Therefore, in producing the printed circuit board with resistors wherein the tin-nickel alloy film is used as the resistor film, it is evident that the copper should not be etched at the time of etching the tin-nickel alloy film. That is to say, an etching solution for use in etching the tin-nickel alloy is required to have no capability of etching copper. When the etching solution for the tin-nickel alloy is able to etch copper, the copper, the surface of which has been covered with a photoresist, is also etched from the side thereof in etching the tin-nickel alloy film. This leads to variations in the length and width of the conductor line and a low accuracy in the resistance of the resistor circuit.

It is apparent from the fact that the tin-nickel alloy is not etched with an ammonia chelate based etching solution, the tin-nickel alloy is generally more stable against many chemicals than copper. For example, it is said that a tin-nickel alloy plated film of a thickness of more than $25\mu$ has an anti-etching property between Monel metal and silver, almost comparable to Inconel.

In production of the printed circuit board with resistors wherein the tin-nickel alloy plated film is used as the resistor film, there has heretofore been employed a procedure wherein the laminated plate material is first dipped in an aqueous solution of hydrochloric acid and then in a mixed acid of sulfuric acid and nitric acid, in order to etch selectively the tin-nickel alloy plated film. With this etching solution, however, the selective etching of the tin-nickel alloy plated film in the presence of copper is not satisfactory.

SUMMARY OF THE INVENTION

An object of this invention is to provide an etching solution for a tin-nickel alloy.

Another object of this invention is to provide an etching solution capable of etching selectively a tin-nickel alloy where the tin-nickel alloy is present with copper.

Another object of this invention is to provide an etching solution for a tin-nickel alloy which can be suitably employed in producing a printed circuit board with resistors by etching selectively a laminated plate material with a tin-nickel alloy film formed on at least one side of an insulative support and a copper layer formed on the tin-nickel alloy film to thereby selectively remove the tin-nickel alloy film.

Another object of this invention is to provide a process for selectively etching a tin-nickel alloy.

These objects are attained by employing an aqueous solution of one or more phosphoric acid compounds selected from the group consisting of phosphoric acid, pyrophosphoric acid and phosphorous acid, or one or more molten phosphoric acid compounds. The use of these compounds enables one to etch selectively the tin-nickel alloy without substantially etching copper.

Therefore, this invention provides an etching solution comprising a 0.1 mol/l or more (preferably 0.2 mol/l or more) phosphoric acid, a 0.05 mol/l or more (preferably 0.1 mol/l or more) pyrophosphoric acid, a 0.1 mol/l or more (preferably 0.2 mol/l or more) phosphorous acid, or 0.1 mol/l or more of a mixture of phosphoric, pyrophosphoric and/or phosphorous acids, or molten phosphoric acid, molten pyrophosphoric acid, molten phosphorous acid or a molten mixture of phosphoric, pyrophosphoric and/or phosphorous acids.

DETAILED DESCRIPTION OF THE INVENTION

Figure 1:
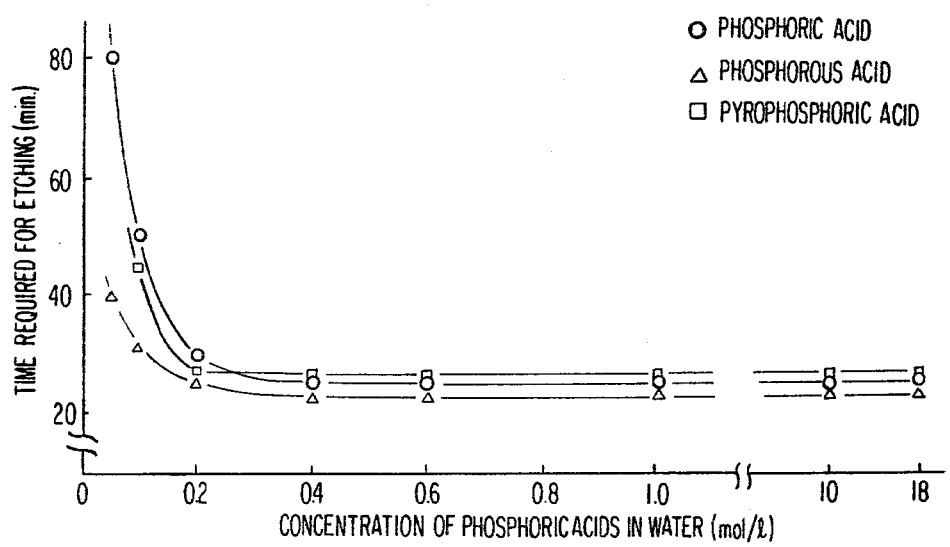
FIG. 1 shows the relation between the concentration of phosphoric acid, pyrophosphoric acid or phosphorous acid and the time required for etching.

In the present invention, phosphoric acid, pyrophosphoric acid and phosphorous acid are genericly referred to as phosphoric acid compounds.

In the etching solution of this invention, the upper limits on the concentrations of the phosphoric acid compounds in water are not critical, and it is to be understood that the term "aqueous solution" as herein used includes not only an unsaturated aqueous solution but also a saturated aqueous solution.

Where the etching solution of this invention consists of an aqueous solution of the phosphoric acid compounds or molten phosphoric acid compounds and does not contain any oxidizing agents and additives as will hereinafter be explained, the etching solution is generally applied at a temperature of not less than about 80° C., preferably about 90° to 95° C. The etching solution heated to these temperatures selectively etches the tin-nickel alloy without substantially etching the copper. For example, it can etch and remove an about 0.1μ thick tin-nickel alloy plated film of a sheet resistance of 25 Ω/□ in about 30 minutes.

Addition of one or more compounds selected from those compounds classified as oxidizing agents having a standard oxidation-reduction potential ($E_o$) of about +0.344 V or more enables the selective etching of the tin-nickel alloy plated film at low temperatures without any substantial etching of copper and in markedly short periods. That is to say, as compared with the case wherein no oxidizing agents are added, the etching temperature can usually be lowered by about 10° C. and the etching period can usually be shortened to about 1/10 the original.

Representative examples of oxidizing agents which can suitably be used in this invention include inorganic and organic salts of copper (e.g., copper (II) phosphate, copper acetate, copper (II) chloride, etc.), nitric acid, nitric acid salts (e.g., silver nitrate, etc.), iron salts (e.g., iron (III) phosphate, iron (III) pyrophosphate, ammonium iron (III) oxalate, etc.), bromates (e.g., potassium bromate, etc.), peroxides (e.g., hydrogen peroxide, etc.), metal oxides (e.g., iron (III) oxide, etc.). Other oxidizing agents which can be used in this invention include chromic acid compounds (e.g., chromium trioxide, chromic acid, etc.), permanganic acid salts (e.g., potassium permanganate, etc.), halogens (e.g., iodine, bromine, etc.), ozone, nitrobenzene, iodoso compounds and the like and mixtures of two or more of the above compounds. Preferred examples of the mixtures are a mixture of copper (II) phosphate and iron (III) phosphate or hydrogen peroxide, and a mixture of iron (III) pyrophosphate and iodine.

The concentration of the oxidizing agent in the etching solution varies depending upon the kind of phosphoric acid compound employed and the kind of oxidizing agent. However, it is usually in a range of about $5 \times 10^{-4}$ to 0.1 mol/l, preferably about $1 \times 10^{-3}$ to $5 \times 10^{-2}$ mol/l. For example, in the case of an etching solution comprising an aqueous solution of phosphoric acid or molten phosphoric acid and copper (II) phosphate, the concentration of copper (II) phosphate is preferably about $1 \times 10^{-3}$ to $6 \times 10^{-3}$ mol/l, more preferably about $2 \times 10^{-3}$ to $5.5 \times 10^{-3}$ mol/l. When the concentration is above $8 \times 10^{-3}$ mol/l, only the boundary area between the tin-nickel alloy film and copper is etched, probably for reasons relating to the difference in electrode potential between the tin-nickel alloy and copper. In the case of an etching solution comprising an aqueous solution of pyrophosphoric acid or molten pyrophosphoric acid and copper (II) phosphate, the copper (II) phosphate is added in the same concentrations above. In the case of an etching solution comprising an aqueous solution of phosphorous acid or molten phosphorous acid and copper (II) phosphate, the concentration of copper (II) phosphate is preferably about $1 \times 10^{-3}$ to $1.9 \times 10^{-2}$ mol/l, more preferably about $2 \times 10^{-3}$ to $1.8 \times 10^{-2}$ mol/l.

In these etching solutions containing an oxidizing agent or oxidizing agent as described above, when added to an aqueous solution of phosphoric acid compound, the etching solution is usually employed at a temperature of not less than about 70° C., with the temperature of about 75° to 95° C. being preferred. On the other hand, when added to molten phosphoric acid compound, the etching solution is usually employed at a temperature of not less than the melting point of the phosphoric acid compound, with temperatures from the melting point of the phosphoric acid compound used to 95° C. being preferred.

On dipping, for example, a copper laminated plate with a tin-nickel alloy plated film of a thickness of 0.1μ and a sheet resistance of 25 Ω/□ in the etching solution in the above temperature range, only the tin-nickel alloy plated film is completely etched and removed in a few minutes, and the copper at the electrode area remains substantially unetched.

It has now been found that those etching solutions prepared by adding a small amount of hydrochloric acid, sulfuric acid or a mixed acid of hydrochloric acid and sulfuric acid to the etching solutions as described above, i.e., comprising an aqueous solution of phosphoric acid compound or molten phosphoric acid compound, or comprising an aqueous solution of phosphoric acid compound or molten phosphoric acid compound and an oxidizing agent or agents as described above, are able to etch the tin-nickel alloy alone at much lower temperatures, in much shorter periods and selectively. The amount of hydrochloric acid added is generally $5\times10^{-3}$ to 2.5 mol/l, preferably $5\times10^{-3}$ to 1.5 mol/l. The amount of sulfuric acid added is generally $5\times10^{-3}$ to 5 mol/l, preferably $5\times10^{-3}$ to 3 mol/l, and that of a mixed acid of hydrochloric acid and sulfuric acid is generally $5\times10^{-3}$ to 3 mol/l, preferably $5\times10^{-3}$ to 1.5 mol/l. In the mixed acid, suitable ratios for the amount of hydrochloric acid to sulfuric acid are about 1:1 to 1:3, and preferred ratios are about 1:1 to 1:2.

When an etching solution consisting of an aqueous solution of phosphoric acid compounds or molten phosphoric acid compounds alone is employed, the etching is, as described above, usually carried out at a temperature of not less than 80° C., preferably 90° to 95° C. On the other hand, when an etching solution prepared by adding hydrochloric acid, sulfuric acid or a mixed acid of hydrochloric acid and sulfuric acid is employed, an etching temperature of 65° to 75° C. is sufficient and furthermore the etching speed is accelerated. Moreover, copper is not materially etched.

When the amount of hydrochloric acid and/or sulfuric acid added is below the above amounts, there is obtained no effect of lowering markedly the etching temperature. On the other hand, when it is above the above range, the selectivity is reduced although the etching speed is accelerated, that is, copper is also undesirably etched. When a mixed acid of hydrochloric acid and sulfuric acid is employed, the content of hydrochloric acid is preferably not more than 2.5 mol/l.

For example, when a tin-nickel alloy plated film of a thickness of about 0.1$\mu$ and a sheet resistance of 25 $\Omega/\square$ is dipped in a 0.1 mol/l aqueous solution of phosphoric acid at a temperature of 75° C., the tin-nickel alloy plated film is not substantially etched. However, when $9.0\times10^{-3}$ mol/l of hydrochloric acid is added to the above etching solution, the above tin-nickel alloy plated film is etched in 60 minutes. On the other hand, on dipping about a 35$\mu$ thick copper foil in the same etching solution at a temperature of 75° C., no material etching of the copper proceeds.

An aqueous solution containing 0.1 mol/l of phosphorous acid and 0.46 mol/l of hydrochloric acid is able to etch the above tin-nickel alloy plated film in 30 minutes at a temperature of 65° C. However, an aqueous solution containing only phosphorous acid is not able to etch the tin-nickel alloy plated film.

The use of those etching solutions prepared by adding an oxidizing agent or agents as described above in combination with hydrochloric acid, sulfuric acid or a mixed acid of hydrochloric acid and sulfuric acid enables one to etch selectively the tin-nickel alloy at markedly low temperatures and at markedly high speeds. In this case, it is possible to etch at a room temperature by selecting the compounds used in combination with the phosphoric acid compounds. For example, an aqueous solution containing 0.1 mol/l of phosphoric acid, $9.0\times10^{-3}$ mol/l of hydrochloric acid and about $10^{-3}$ mol/l of copper (II) phosphate is able to etch the above tin-nickel alloy plated film in 20 minutes. With an increase in the concentration of hydrochloric acid, the etching speed further increases, and the etching is usually completed within several minutes. The amount of the oxidizing agent added to the etching solutions containing hydrochloric acid and/or sulfuric acid varies depending upon the kind of the oxidizing agent and phosphoric acid compound employed, but it is usually in a range of about $5\times10^{-4}$ to 0.1 mol/l, more preferably about $1\times10^{-3}$ to $5\times10^{-2}$ mol/l as discussed above. In more detail, when the etching solution comprises an aqueous solution of phosphoric acid or molten phosphoric acid, hydrochloric acid or sulfuric acid, and copper (II) phosphate, the concentration of copper (II) phosphate is preferably about $1\times10^{-3}$ to $6\times10^{-3}$ mol/l. In the case of an etching solution comprising an aqueous solution of pyrophosphoric acid or molten pyrophosphoric acid, hydrochloric acid or sulfuric acid, and copper (II) phosphate, the concentration of the copper (II) phosphate is the same as above. On the other hand, when the etching solution comprises an aqueous solution of phosphorous acid or molten phosphorous acid, hydrochloric acid or sulfuric acid, and silver nitrate, the concentration of copper (II) phosphate is preferably about $1\times10^{-3}$ to $2\times10^{-2}$ mol/l. In the case of an etching solution comprising an aqueous solution of pyrophosphoric acid or molten pyrophosphoric acid, sulfuric acid, and potassium bromate or ammonium iron (III) oxalate, the concentration of these oxidizing agents is preferably about $1\times10^{-3}$ to $5\times10^{-2}$ mol/l.

As described above in detail, the etching solution of this invention is able to etch selectively the tin-nickel alloy in the presence of copper. Therefore, in producing the printed circuit board with resistors from the laminated material comprising the insulative support, the resistor film of tin-nickel alloy provided on the insulative support, and the high conductive layer of copper provided on the resistor film by the above-described procedures, the etching solution of this invention can be suitably employed in etching selectively the tin-nickel alloy resistor film.

That is to say, in etching the copper layer at those areas not covered with the photoresist after the combined pattern of conductor and resistor has been formed on the surface of the above laminated material by use of the photoresist, and then in etching the exposed tin-nickel alloy film, the etching solution of this invention is employed.

Figure 4:
FIGS. 4 to 12 illustrate manufacture of a printed circuit board using the etching solution of this invention with both overhead and cross-sectional views.
Figure 5:
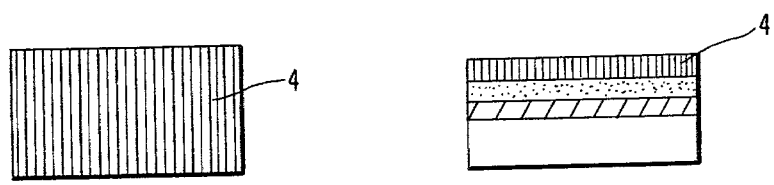
Figure 6:
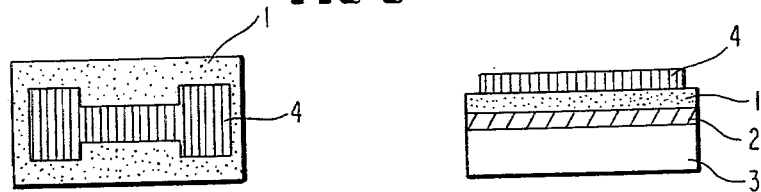
Figure 7:
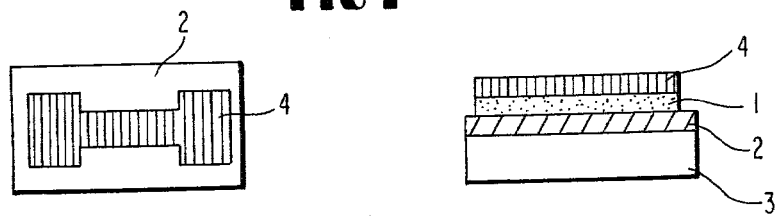
Figure 8:
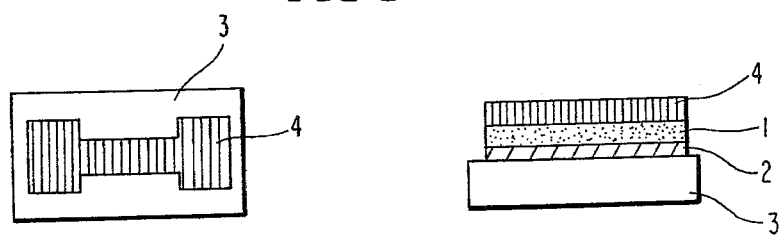

The above-described manufacture steps of the printed circuit board with resistor are shown in FIGS. 4 to 12. FIG. 4 shows a laminated material comprising an insulative support (3), a resistor film of tin-nickel alloy (2) and a high conductive layer of copper (1). The formation of a combined pattern of conductor and resistor is shown by FIGS. 5 and 6. For example, in FIG. 5 a photoresist (4) is covered on the surface of the copper layer. The photoresist is then exposed to light through a photomask having a combined pattern of conductor and resistor areas and developed. Thus, the photoresist is left corresponding to the pattern as shown in FIG. 6. At the areas not covered with the photoresist the copper layer is removed by etching using an etching solution for copper to obtain a product having exposed resistor film of tin-nickel alloy as shown in FIG. 7. The thus-exposed tin-nickel alloy film is then removed by etching using the etching solution of this invention to obtain a product as shown in FIG. 8. In etching the resistor film of the tin-nickel alloy, it is not necessary to leave the photoresist on the surface of the copper layer, because the etching solution of this invention does not etch copper.

Figure 9:
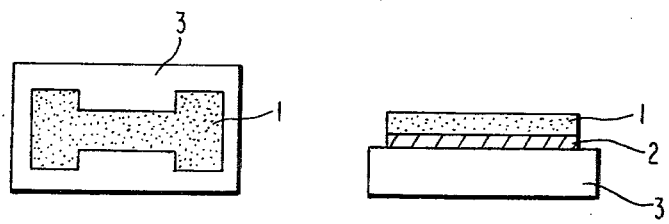
Figure 10:
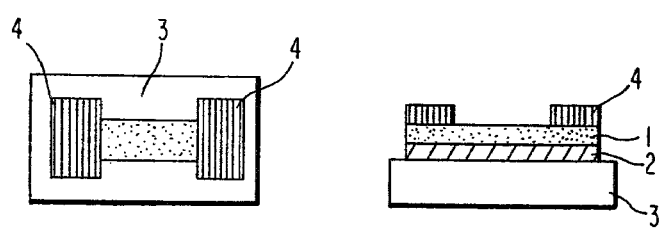
Figure 11:
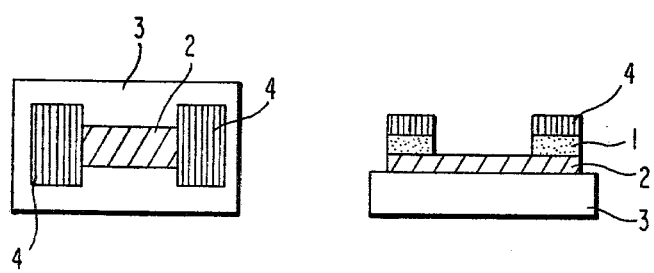
Figure 12:
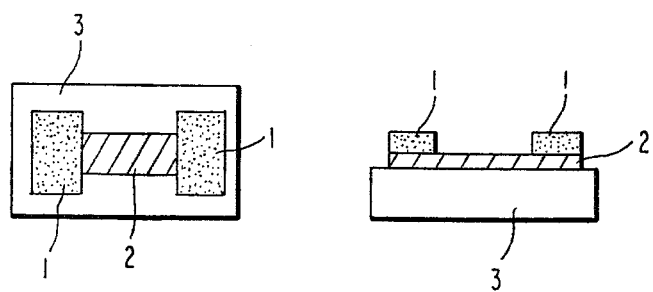

If the photoresist remains, it is then removed as shown in FIG. 9, the surface of the laminated plate material is covered with a fresh photoresist and in the same manner as described above, a photomask having a conductor pattern is employed and the photoresist is left corresponding to the conductor pattern of the photomask as shown in FIG. 10. At the areas not covered with the photoresist, the copper layer is removed to obtain a product having an exposed resistor film of tin-nickel alloy as shown in FIG. 11. Thereafter, on removing the remaining photoresist, a circuit corresponding to the above conductor and resistor pattern is formed on the insulative support, and thus a printed circuit board with resistor is obtained.

The tin-nickel alloy in the laminated plate material contains tin element in an amount of from about 50 to 85% by weight. The thickness of the alloy as a resistor layer is usually about 70 to 2,000 Å. The thickness of the copper layer is usally about 5 to 70 microns. The thickness of the insulative support is usually about 25 microns to 3 mm. More specifically, when the support is a flexible one such as a heat resistant plastic film (e.g., a polyimide film), the thickness is usually about 25 to 100 microns, and when the support is a rigid one such as a laminated board, the thickness is usually about 1 to 3 mm.

The thus obtained printed circuit board with resistors is quite excellent in the low variation of length and width of elements and the accuracy of resistance of resistor elements since the resistor film comprising the tin-nickel alloy has excellent stability, smoothness and uniform electrodepositing property and, furthermore, copper is not materially etched (that is, the copper is not etched not only from the surface (even without having a photoresist thereon) but also from the side thereof) at the etching of the resistor film.

Further, the etching solution of this invention can be suitably employed in modifying the form of a resistor pattern of tin-nickel alloy in a printed circuit board with resistors. That is, a resist is formed on the surface of a resistor layer of tin-nickel alloy and the uncovered portions of the resistor layer are removed by etching using the etching solution of this invention.

In production of the above printed circuit board with resistors, the copper layer is removed by etching and, if desired, the tin-nickel alloy resistor film can be removed by etching after being dipped in 5 to 20% by weight of hydrochloric acid for about 5 to about 60 seconds. The reason for this is that a thin film in the passive state is considered to be formed on the surface of the tin-nickel alloy film with a lapse of time after the etching of copper, and that in some cases, the so formed thin film in the passive state inhibits the smooth etching of the tin-nickel alloy film.

Therefore, when the tin-nickel alloy film is etched a long period time after the etching of copper is completed, it is preferred in some cases that the tin-nickel alloy film is dipped in hydrochloric acid in advance. However, when the tin-nickel alloy is etched immediately after the etching of copper, no treatment with hydrochloric acid is needed.

The following examples are given to explain this invention in greater detail.

EXAMPLE 1

A laminated material prepared by providing a tin-nickel alloy film of a thickness of about $0.1\mu$ and a sheet resistance of 25 $\Omega/\square$ on a copper foil was dipped in an aqueous solution of phosphoric acid, pyrophosphoric acid or phosphorous acid, the aqueous solution having various concentrations, at 95° C., and the time required for etching the tin-nickel alloy film was measured. The results are shown in FIG. 1.

In FIG. 1, the actual concentrations of pyrophosphoric acid are half ($\frac{1}{2}$) of those indicated on the axial scale (mol/l).

In all cases, copper was not materially etched, and no change in appearance was observed.

EXAMPLE 2

A laminated material prepared by providing a tin-nickel alloy film of a sheet resistance of 25 $\Omega/\square$ on a copper foil was dipped in an etching solution comprising $3.2 \times 10^{-3}$ mol/l of copper (II) phosphate and an aqueous solution of phosphoric acid, pyrophosphoric acid or phosphorous acid, the aqueous solution having various concentrations, at 83° C., and the time required for etching the tin-nickel alloy was measured. The results are shown in FIG. 2.

Figure 2:
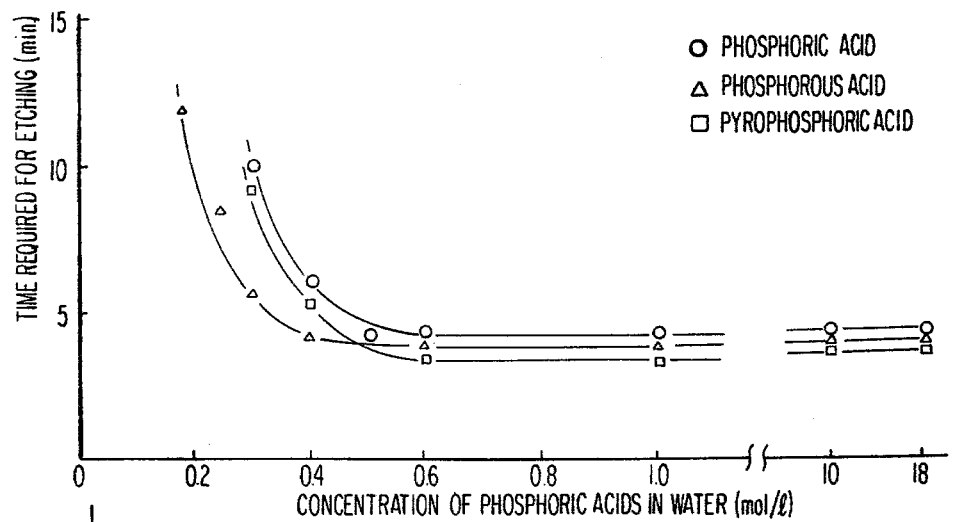
FIG. 2 shows the relation between the concentration of phosphoric acid, pyrophosphoric acid or phosphorous acid, with the concentration of copper (II) phosphate additive constant, and the time required for etching.

In FIG. 2, the actual concentration of pyrophosphoric acid is half ($\frac{1}{2}$) of those indicated on the axial scale (mol/l).

EXAMPLE 3

Figure 3:
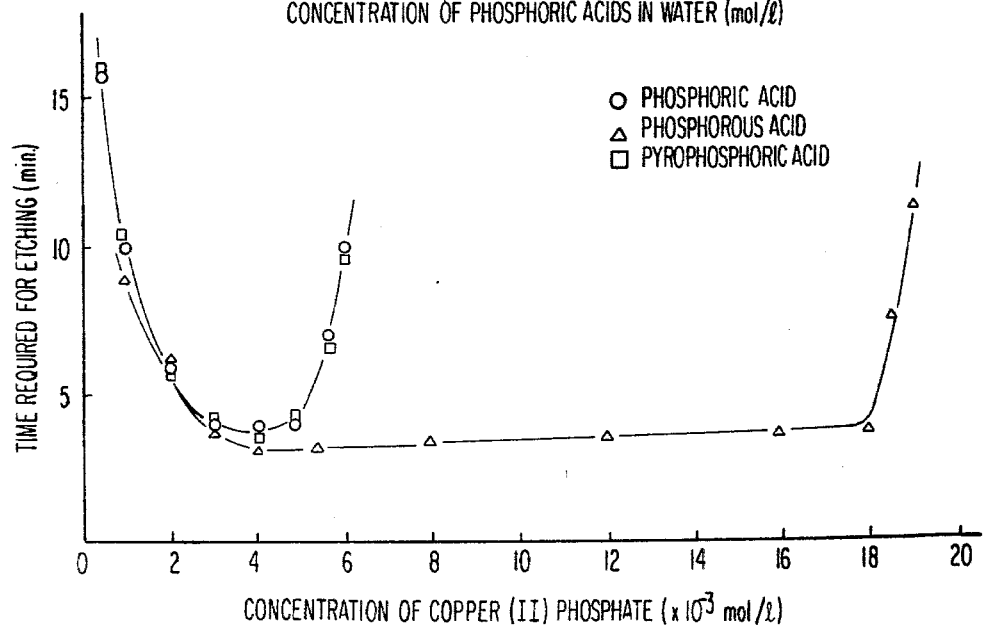
FIG. 3 shows the relation between the concentration of copper (II) phosphate added to a constant concentration of an aqueous solution of phosphoric acid, pyrophosphoric acid or phosphorous acid, and the time required for etching.

A laminated material prepared by providing a tin-nickel alloy film of a sheet resistance of 25 $\Omega/\square$ on a copper foil was dipped in an etching solution comprising a 5.6 mol/l aqueous solution of phosphoric acid or 5.6 mol/l aqueous solution of phosphorous acid or 2.8 mol/l aqueous solution of pyrophosphoric acid, and various concentrations of copper (II) phosphate at 83° C. The time required for etching the tin-nickle alloy film was measured. The results are shown in FIG. 3.

EXAMPLE 4

Various oxidizing agents were added to a 9.4 mol/l aqueous solution of phosphoric acid, and the resulting mixture was heated to 83° C. In this mixture was dipped a laminated material prepared by providing a tin-nickel alloy plated film of a sheet resistance of 25 $\Omega/\square$ on a copper foil. The time required for etching the tin-nickel alloy film was measured. The concentration of the oxidizing agent was 0.004 mol/l except for the case where that of hydrogen peroxide was 0.0027 mol/l.

The results are shown in Table 1.

TABLE 1

| Oxidizing Agent | Time Required for Etching (min) |
| --- | --- |
| Silver Nitrate | 3 |
| Copper Nitrate | 12 |
| Hydrogen Peroxide | 8 |
| Iron (III) Phosphate | 4 |
| Potassium Bromate | 2 |
| Iron (III) Pyrophosphate | 12 |
| Copper Acetate | 4 |
| Ammonium Iron (III) Oxalate | 4 |
| Copper Chloride | 5 |
| Iron (III) Oxide | 4 |

EXAMPLE 5

An about $35\mu$ thick electrolytic copper foil was dipped in an etching solution containing 9.4 mol/l of phosphoric acid and $4.0 \times 10^{-3}$ mol/l of copper (II) phosphate at 83° C. for 10 minutes, and the reduction in the weight of the copper foil was less than 0.1%.

On the other hand, when the same electrolytic copper foil as used above was dipped in 2.9 mol/l hydrochloric acid at a temperature of 25° C. for 1 minute, washed with water, and then dipped in a conventional etching solution containing 11.2 mol/l of sulfuric acid and 0.7 mol/l of nitric acid at a temperature of 25° C. for 10 minutes, the reduction in the weight of the copper foil reached as much as 38.4%.

EXAMPLE 6

A laminated plate material comprising an insulative support composed of a glass cloth impregnated with an epoxy resin having a thickness of about 1.0 mm, a tin-nickel alloy resistor film having a thickness of about 0.1μ and a sheet resistance of 25 Ω/□ provided on said insulative support and a copper combined conductor and resistor pattern having a thickness of about 35μ provided on said tin-nickel alloy film was dipped in a heated aqueous solution of phosphoric acid containing hydrochloric acid, and the time required for etching the developed tin-nickel alloy film in the laminated plate material was measured. For comparison, the same laminated plate material was dipped in an aqueous solution of phosphoric acid containing no hydrochloric acid, and the time required for etching the tin-nickel alloy film was measured. The results are shown in Table 2.

It can be seen from the results that the use of the etching solution containing hydrochloric acid shortens the time required for etching to about half at the same etching temperature.

A 35μ thick electrolytic copper foil was dipped in each etching solution at each etching temperature for 10 minutes, and the reduction in the weight of the copper foil was measured. The results are shown in Table 2.

TABLE 2

| Phosphoric Acid (mol/l) | Hydrochloric Acid (mol/l) | Etching Temperature (°C.) | Time Required for Etching (min) | Reduction in Weight of Copper (%) |
|---|---|---|---|---|
| 0.1 | 0 | 75 | x | less than 0.1 |
| " | " | 95 | 40 | less than 0.1 |
| " | 9.0 × 10⁻³ | 75 | 60 | less than 0.1 |
| " | " | 95 | 20 | less than 0.1 |
| 18.0 | 0 | 75 | 60 | less than 0.1 |
| " | " | 95 | 25 | less than 0.1 |
| " | 1.3 | 75 | 35 | 0.5 |
| " | " | 95 | 12 | 1.0 |

Note:
x indicates that the etching does not substantially proceed.

It can be seen from the results that when the concentration of hydrochloric acid to be used is low, copper is not substantially etched, and that the reduction in the weight of copper somewhat increases when increasing the concentration of hydrochloric acid although the reduction to such an extent causes no problems for practical uses.

EXAMPLES 7 AND 8

The same laminated plate material as used in Example 6 was dipped in an aqueous solution of phosphoric acid containing hydrochloric acid and copper (II) phosphate, and the time required for etching the developed tin-nickel alloy film in the material was measured. For comparison, the same laminated plate material as used above was dipped in an aqueous solution of phosphoric acid containing only copper (II) phosphate (not containing hydrochloric acid), and the time required for etching was measured. The results are shown in Tables 3 and 4.

TABLE 3

| Phosphoric Acid (mol/l) | Copper (II) Phosphate (mol/l) | Hydrochloric Acid (mol/l) | Etching Temp. (°C.) | Time Required for Etching (min) | Reduction in Weight of Copper (%) |
|---|---|---|---|---|---|
| 0.1 | 1.0 × 10⁻³ | 0 | 30 | x | less than 0.1 |
| " | " | " | 80 | 15 | less than 0.1 |
| " | " | 9.0 × 10⁻³ | 30 | 20 | less than 0.1 |
| " | " | 9.0 × 10⁻³ | 80 | 10 | 0.2 |
| 18.0 | 6.0 × 10⁻³ | 0 | 30 | x | less than 0.1 |
| " | " | " | 80 | 15 | less than 0.1 |
| " | " | 1.3 | 30 | 15 | 0.2 |
| " | " | " | 80 | 4 | 4.0 |

TABLE 4

| Phosphoric Acid (mol/l) | Copper (II) Phosphate (mol/l) | Hydrochloric Acid (mol/l) | Etching Temp. (°C.) | Time Required for Etching (min) | Reduction in Weight of Copper (%) |
|---|---|---|---|---|---|
| 5.6 | 4.3 × 10⁻³ | 0 | 50 | x | less than 0.1 |
| " | " | " | 60 | 40 | less than 0.1 |
| " | " | " | 85 | 3 | less than 0.1 |
| " | " | 9.0 × 10⁻³ | 18 | 40 | less than 0.1 |
| " | " | 9.0 × 10³¹³ | 30 | 24 | less than 0.1 |
| " | " | 9.0 × 10⁻³ | 50 | 11 | 0.1 |
| " | " | 0.4 | 18 | 13 | " |
| " | " | " | 30 | 10 | 0.4 |
| " | " | " | 50 | 6 | 2.5 |
| " | " | 1.3 | 18 | 11 | 0.2 |
| " | " | " | 30 | 8 | 0.8 |
| " | " | " | 50 | 4 | 4.0 |

It can be seen from the results that the use of the etching solution containing hydrochloric acid enables to etch smoothly the tin-nickel alloy film at a room temperature, but that with the etching solution containing no hydrochloric acid, the etching does not proceed at a room temperature.

EXAMPLE 9

The procedure of Example 6 was repeated wherein an aqueous solution of phosphorous acid was used in place of the aqueous solution of phosphoric acid, and the time required for etching was measured. The results are shown in Table 5.

TABLE 5

| Phosphorous Acid (mol/l) | Silver Nitrate (mol/l) | Hydrochloric Acid (mol/l) | Etching Temp. (°C.) | Time Required for Etching (min) | Reduction in Weight of Copper (%) |
|---|---|---|---|---|---|
| 0.1 | 0 | 0 | 65 | x | less than 0.1 |

TABLE 5-continued

| Phosphorous Acid (mol/l) | Silver Nitrate (mol/l) | Hydrochloric Acid (mol/l) | Etching Temp. (°C.) | Time Required for Etching (min) | Reduction in Weight of Copper (%) |
|---|---|---|---|---|---|
| " | " | 0.46 | " | 30 | 3.0 |
| 18.0 | " | 0 | " | x | less than 0.1 |
| " | " | 0.46 | " | 30 | 3.0 |
| 5.6 | 2.0 × 10$^{-2}$ | 9.0 × 10$^{-3}$ | 18 | 40 | less than 0.1 |
| " | " | 9.0 × 10$^{-3}$ | 30 | 25 | less than 0.1 |
| " | " | 0.4 | 18 | 12 | 0.1 |
| " | " | " | 30 | 10 | 0.4 |
| " | " | 1.3 | 18 | 11 | 0.2 |
| " | " | " | 30 | 8 | 0.8 |

EXAMPLE 10

The procedure of Example 6 was repeated wherein sulfuric acid was used in place of hydrochloric acid, and the time required for etching was measured. The results are shown in Table 6.

TABLE 6

| Phosphoric Acid (mol/l) | Copper (II) Phosphate (mol/l) | Sulfuric Acid (mol/l) | Etching Temp. (°C.) | Time Required for Etching (min) | Reduction in Weight of Copper (%) |
|---|---|---|---|---|---|
| 0.1 | 1.0 × 10$^{-3}$ | 0 | 55 | x | less than 0.1 |
| " | " | " | 80 | 15 | less than 0.1 |
| " | " | 9.0 × 10$^{-3}$ | 55 | 30 | less than 0.1 |
| " | " | 9.0 × 10$^{-3}$ | 80 | 10 | less than 0.1 |
| 5.6 | 4.3 × 10$^{-3}$ | 0 | 55 | 60 | less than 0.1 |
| " | " | " | 80 | 4 | less than 0.1 |
| " | " | 0.6 | 55 | 15 | less than 0.1 |
| " | " | " | 80 | 4 | 0.4 |
| 18.0 | 6.0 × 10$^{-3}$ | 0 | 55 | x | less than 0.1 |
| " | " | " | 80 | 15 | less than 0.1 |
| " | " | 2.4 | 55 | 17 | 0.3 |
| " | " | " | 80 | 4 | 2.0 |

EXAMPLES 11 AND 12

The procedure of Example 6 was repeated wherein an aqueous solution of pyrophosphoric acid was used in place of the aqueous solution of phosphoric acid. The results are shown in Tables 7 and 8.

TABLE 7

| Pyrophosphoric Acid (mol/l) | Ammonium Iron (III) Oxalate (mol/l) | Sulfuric Acid (mol/l) | Etching Temp. (°C.) | Time Required for Etching (min) | Reduction in Weight of Copper (%) |
|---|---|---|---|---|---|
| 0.05 | 1.0 × 10$^{-3}$ | 0 | 55 | x | less than 0.1 |
| " | " | " | 80 | 15 | less than 0.1 |
| " | " | 9.0 × 10$^{-3}$ | 55 | 30 | less than 0.1 |
| " | " | 9.0 × 10$^{-3}$ | 80 | 10 | less than 0.1 |
| 2.8 | 8.0 × 10$^{-3}$ | 0 | 55 | 60 | less than 0.1 |

TABLE 7-continued

| Pyrophosphoric Acid (mol/l) | Ammonium Iron (III) Oxalate (mol/l) | Sulfuric Acid (mol/l) | Etching Temp. (°C.) | Time Required for Etching (min) | Reduction in Weight of Copper (%) |
|---|---|---|---|---|---|
| " | " | " | 80 | 5 | less than 0.1 |
| " | " | 0.6 | 55 | 15 | less than 0.1 |
| " | " | " | 80 | 7 | 0.3 |
| 9.0 | 5.0 × 10$^{-2}$ | 0 | 55 | x | less than 0.1 |
| " | " | " | 80 | 15 | less than 0.1 |
| " | " | 2.4 | 55 | 17 | 0.3 |
| " | " | " | 80 | 7 | 1.5 |

TABLE 8

| Pyrophosphoric Acid (mol/l) | Potassium Bromate (mol/l) | Sulfuric Acid (mol/l) | Etching Temp. (°C.) | Time Required for Etching (min) | Reduction in Weight of Copper (%) |
|---|---|---|---|---|---|
| 0.05 | 5.0 × 10$^{-3}$ | 0 | 55 | x | less than 0.1 |
| " | " | " | 80 | 5 | less than 0.1 |
| " | " | 2.4 | 55 | 20 | 0.2 |
| " | " | " | 80 | 4 | 2.0 |
| 9.0 | " | 0 | 55 | x | less than 0.1 |
| " | " | " | 80 | 5 | less than 0.1 |
| " | " | 9.0 × 10$^{-3}$ | 55 | 15 | less than 0.1 |
| " | " | 9.0 × 10$^{-3}$ | 80 | 4 | less than 0.1 |

EXAMPLE 13

The procedure of Example 6 was repeated wherein an aqueous solution of phosphoric acid containing hydrochloric acid and sulfuric acid was used in place of the aqueous solution of phosphoric acid, and the time required for etching was measured. The results are shown in Table 9.

TABLE 9

| Phosphoric Acid (mol/l) | Hydrochloric Acid (mol/l) | Sulfuric Acid (mol/l) | Etching Temp. (°C.) | Time Required for Etching (min) | Reduction in Weight of Copper (%) |
|---|---|---|---|---|---|
| 0.1 | 0 | 0 | 75 | x | less than 0.1 |
| " | " | " | 95 | 40 | less than 0.1 |
| " | 5.0 × 10$^{-3}$ | 4.0 × 10$^{-3}$ | 75 | 65 | less than 0.1 |
| " | 5.0 × 10$^{-3}$ | " | 95 | 20 | less than 0.1 |
| 18.0 | 0 | 0 | 75 | 65 | less than 0.1 |
| " | " | " | 95 | 25 | less than 0.1 |
| " | 0.8 | 0.7 | 75 | 35 | 0.3 |
| " | " | " | 95 | 12 | 1.0 |

EXAMPLE 14

The procedure of Example 6 was repeated wherein an aqueous solution of phosphorous acid containing hydrochloric acid and sulfuric acid was used in place of the aqueous solution of phosphoric acid, and the time required for etching was measured. The results are shown in Table 10.

TABLE 10

| Phosphorous Acid (mol/l) | Copper (II) Phosphate (mol/l) | Hydrochloric Acid (mol/l) | Sulfuric Acid (mol/l) | Etching Temp. (°C.) | Time Required for Etching (min) | Reduction in Weight of Copper (%) |
|---|---|---|---|---|---|---|
| 0.1 | 0 | 0 | 0 | 65 | λ | less than 0.1 |
| " | " | 0.3 | 0.2 | " | 35 | 2.0 |
| 18.0 | " | 0 | 0 | " | x | less than 0.1 |
| " | " | 0.3 | 0.2 | " | 33 | 2.0 |
| 5.6 | $4.3 \times 10^{-3}$ | $5.0 \times 10^{-3}$ | $4.0 \times 10^{-3}$ | 18 | 47 | less than 0.1 |
| " | $4.3 \times 10^{-3}$ | $5.0 \times 10^{-3}$ | $4.0 \times 10^{-3}$ | 30 | 25 | less than 0.1 |
| " | $4.3 \times 10^{-3}$ | 0.2 | 0.2 | 18 | 15 | less than 0.1 |
| " | $4.3 \times 10^{-3}$ | " | " | 30 | 13 | 0.1 |
| " | $4.3 \times 10^{-3}$ | 0.7 | 0.6 | 18 | 11 | 0.2 |
| " | $4.3 \times 10^{-3}$ | " | " | 30 | 8 | 0.7 |

While the invention has been described in detail and with reference to specific embodiments thereof, it will be apparent to one skilled in the art that various changes and modifications can be made therein without departing from the spirit and scope thereof.

What is claimed is:

1. A process for etching a tin-nickel alloy which comprises etching the alloy at a temperature of greater than about 80° C. with a solution containing at least one phosphoric acid compound selected from the group consisting of 0.1 mol/l or more phosphoric acid, 0.05 mol/l or more pyrophosphoric acid, 0.1 mol/l or more phosphorous acid, 0.1 mol/l or more of a mixture of phosphoric, pyrophosphoric and/or phosphorous acids, molten phosphoric acid, molten pyrophosphoric acid, molten phosphorous acid and a molten mixture of phosphoric, pyrophosphoric and/or phosphorous acids.

2. The process of claim 1, wherein said etching is conducted at a temperature of about 90° to 95° C.

3. The process of claim 1, wherein said etching solution contains molten phosphorous acid, molten phosphoric acid, or molten pyrophosphoric acid and etching is conducted at a temperature from the melting point of the acid to 95° C.

4. The process of claim 1, wherein said tin-nickel alloy is provided on the surface of a copper foil and said process comprises dipping said laminate in said etching solution.

5. The process of claim 4, wherein a printed circuit is formed.

6. In a process for preparing a printed circuit board from a laminate comprising an insulative support, a tin-nickel alloy resistor layer provided on said support and a copper conductor pattern provided on the surface of said tin-nickel alloy, the improvement which comprises etching said tin-nickel alloy by the process of claim 1.

7. The process of claim 6, wherein said etching is conducted at a temperature of about 90° and 95° C.

8. The process of claim 6, wherein said etching solution contains molten phosphorous acid, molten phosphoric acid, or molten pyrophosphoric acid and etching is conducted at a temperature from the melting point of the acid to 95° C.

9. The process of claim 6, wherein said laminate is dipped in said etching solution.

10. A process for etching a tin-nickel alloy which comprises etching the alloy at a temperature of greater than about 70° C. with a solution containing (a) at least one phosphoric acid compound selected from the group consisting of 0.1 mol/l or more phosphoric acid, 0.05 mol/l or more pyrophosphoric acid, 0.1 mol/l or more phosphorous acid, 0.1 mol/l or more of a mixture of phosphoric, pyrophosphoric and/or phosphorous acids, molten phosphoric acid, molten pyrophosphoric acid, molten phosphorous acid and a molten mixture of phosphoric, pyrophosphoric and/or phosphorous acids, and (b) an oxidizing agent.

11. The process of claim 10, wherein said tin-nickel alloy is provided on the surface of a copper foil and said process comprises dipping said laminate in said etching solution.

12. The process of claim 11, wherein a printed circuit is formed.

13. The process of claim 10, wherein said oxidizing agent has standard oxidation-reduction potential ($E_o$) of about +0.344 V or more.

14. The process of claim 13, wherein said oxidizing agent is one or more compound selected from the group consisting of nitric acid, a nitric acid salt, a copper salt, an iron salt, a bromate, a peroxide, a metal oxide, a chromic acid compound, a permanganic acid salt, a halogen, an ozone, a nitrobenzene and an iodoso compound.

15. The process of claim 14, wherein said oxidizing agent comprises copper (II) phosphate.

16. The process of claim 15, wherein said etching solution contains phosphoric acid and said copper (II) phosphate is present in an amount of about $1 \times 10^{-3}$ to $6 \times 10^{-3}$ mol/l.

17. The process of claim 15, wherein said etching solution contains pyrophosphoric acid and said copper (II) phosphate is present in an amount of about $1 \times 10^{-3}$ to $6 \times 10^{-3}$ mol/l.

18. The process of claim 15, wherein said etching solution contains phosphorous acid and said copper (II) phosphate is present in an amount of about $1 \times 10^{-3}$ to $1.9 \times 10^{-2}$ mol/l.

19. The process of claim 10, wherein said oxidizing agent is present in an amount of about $5 \times 10^{-4}$ to 0.1 mol/l.

20. The process of claim 19, wherein said oxidizing agent is present in an amount of about $1 \times 10^{-3}$ to $5 \times 10^{-2}$ mol/l.

21. The process of claim 10, wherein etching is conducted at a temperature of about 75° to 95° C.

22. In a process for preparing a printed circuit board from a laminate comprising an insulative support, a tin-nickel alloy resistor layer provided on said support and a copper conductor pattern provided on the surface of said tin-nickel alloy, the improvement which comprises etching said tin-nickel alloy by the process of claim 10.

23. The process of claim 22, wherein said laminate is dipped in said etching solution.

24. The process of claim 22, wherein said oxidizing agent has a standard oxidation-reduction potential ($E_o$) of about +0.344 V or more.

25. The process of claim 24, wherein said oxidizing agent is one or more compound selected from the group consisting of nitric acid, a nitric acid salt, a copper salt, an iron salt, a bromate, a peroxide, a metal oxide, a chromic acid compound, a permanganic acid salt, a halogen, an ozone, a nitrobenzene and an iodoso compound.

26. The process of claim 25, wherein said oxidizing agent comprises copper (II) phosphate.

27. The process of claim 26, wherein said etching solution contains phosphoric acid and said copper (II) phosphate is present in an amount of about $1 \times 10^{-3}$ to $6 \times 10^{-3}$ mol/l.

28. The process of claim 26, wherein said etching solution contains pyrophosphoric acid and said copper (II) phosphate is present in an amount of about $1 \times 10^{-3}$ to $6 \times 10^{-3}$ mol/l.

29. The process of claim 26, wherein said etching solution contains phosphorous acid and said copper (II) phosphate is present in an amount of about $1 \times 10^{-3}$ to $1.9 \times 10^{-2}$ mol/l.

30. The process of claim 22, wherein said oxidizing agent is present in an amount of about $5 \times 10^{-4}$ to 0.1 mol/l.

31. The process of claim 30, wherein said oxidizing agent is present in an amount of about $1 \times 10^{-3}$ to $5 \times 10^{-2}$ mol/l.

32. The process of claim 22, wherein etching is conducted at a temperature of about 75° to 95° C.

33. A process for etching a tin-nickel alloy which comprises etching the alloy with a solution containing (a) at least one of a phosphoric acid compound selected from the group consisting of 0.1 mol/l or more phosphoric acid, 0.05 mol/l or more pyrophosphoric acid, 0.1 mol/l or more phosphorous acid, 0.1 mol/l or more of a mixture of phosphoric, pyrophosphoric and/or phosphorous acids, molten phosphoric acid, molten pyrophosphoric acid, molten phosphorous acid and a molten mixture of phosphoric, pyrophosphoric and/or phosphorous acids, (b) an oxidizing agent and (c) hydrochloric acid, sulfuric acid or a mixture thereof.

34. The process of claim 33, wherein said tin-nickel alloy is provided on the surface of a copper foil and said process comprises dipping said laminate in said etching solution.

35. The process of claim 34, wherein a printed circuit is formed.

36. The process of claim 33, wherein said hydrochloric acid is used in an amount of about $5 \times 10^{-3}$ to 2.5 mol/l, said sulfuric acid is in an amount of about $5 \times 10^{-3}$ to 5 mol/l and said mixture of acid is used in an amount of about $5 \times 10^{-3}$ to 3 mol/l.

37. The process of claim 33, wherein etching is conducted at a temperature of at least about 65° C.

38. The process of claim 33, wherein etching is carried out at a room temperature.

39. The process of claim 38, wherein said oxidizing agent is copper (II) phosphate.

40. In a process for preparing a printed circuit board from a laminate comprising an insulative support, a tin-nickel alloy resistor layer provided on said support and a copper conductor pattern provided on the surface of said tin-nickel alloy, the improvement which comprises etching said tin-nickel alloy by the process of claim 33.

41. The process of claim 40, wherein said laminate is dipped in said etching solution.

42. The process of claim 40, wherein said hydrochloric acid is used in an amount of about $5 \times 10^{-3}$ to 2.5 mol/l, said sulfuric acid is used in an amount of about $5 \times 10^{-3}$ to 5 mol/l and said mixture of acid is used in an amount of about $5 \times 10^{-3}$ to 3 mol/l.

43. The process of claim 40, wherein etching is conducted at a temperature of at least about 65° C.

44. The process of claim 40, wherein etching is carried out at a room temperature.

45. The process of claim 44, wherein said oxidizing agent is copper (II) phosphate.

* * * * *